United States Patent
Watt et al.

(10) Patent No.: US 6,797,644 B2
(45) Date of Patent: Sep. 28, 2004

(54) METHOD TO REDUCE CHARGE INTERFACE TRAPS AND CHANNEL HOT CARRIER DEGRADATION

(75) Inventors: Victor Watt, Plano, TX (US); Beth Walden, deceased, late of Wyoming, MN (US), by Carl Walden, legal representative; Brian K. Kirkpatrick, Allen, TX (US); Edmund G. Russell, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 103 days.

(21) Appl. No.: 09/906,515

(22) Filed: Jul. 16, 2001

(65) Prior Publication Data

US 2002/0132493 A1 Sep. 19, 2002

Related U.S. Application Data

(60) Provisional application No. 60/222,209, filed on Aug. 1, 2000.

(51) Int. Cl.[7] ................................................. H01I 21/31
(52) U.S. Cl. ..................................................... 438/773
(58) Field of Search ............................... 438/308, 585, 438/758, 762, 766, 770, 773, 774, 800

(56) References Cited

U.S. PATENT DOCUMENTS

| 5,872,387 | A | * | 2/1999 | Lyding et al. | 257/607 |
|---|---|---|---|---|---|
| 5,972,765 | A | * | 10/1999 | Clark et al. | 438/308 |
| 6,147,014 | A | * | 11/2000 | Lyding et al. | 438/798 |
| 6,187,665 | B1 | * | 2/2001 | Chetlur et al. | 438/627 |
| 6,191,463 | B1 | * | 2/2001 | Mitani et al. | 257/411 |
| 6,281,138 | B1 | * | 8/2001 | Brady et al. | 438/762 |
| 6,544,862 | B1 | * | 4/2003 | Bryan | 438/455 |

FOREIGN PATENT DOCUMENTS

| EP | 0 892 424 A2 | 1/1999 |
|---|---|---|
| JP | 54043679 | 4/1979 |
| JP | 07297178 | 11/1995 |
| JP | 10012609 | 1/1998 |
| JP | 11330476 | 11/1999 |
| WO | WO 94/19829 | 9/1994 |

OTHER PUBLICATIONS

Mikkelsen, "Secondary ion mass spectrometry characterization of H2O–D2 and H2O–O–18 steam oxidation of silicon", Journal of Electronic materials 1982, vol. 11, No. 3, pp. 541–558.*

Mitani, Yuichiro, et al., "Highly Reliable Gate Oxide under Fowler–Nordheim Electron Injection by Deuterium Pyrogenic Oxidation and Deuterated Poly–Si Deposition," XP–000988856, 2000 IEEE, pp. 14.6.1–14.6.4.

* cited by examiner

*Primary Examiner*—Evan Pert
*Assistant Examiner*—Lisa Kilday
(74) *Attorney, Agent, or Firm*—Peter K. McLarty; W. James Brady, III; Frederick J. Telecky, Jr.

(57) ABSTRACT

Using deuterium oxygen during stream oxidation forms an oxidizing vapor. Since deuterium is chemically similar to hydrogen, the oxidation process takes place normally and the silicon-silicon oxide interface is concurrently saturated with deuterium. Saturating the interface with deuterium reduces the interface trap density thereby reducing channel hot carrier degradation.

5 Claims, 1 Drawing Sheet

METHOD TO REDUCE CHARGE INTERFACE TRAPS AND CHANNEL HOT CARRIER DEGRADATION

This application claims priority under 35 USC § 119(e)(1) of provisional application Ser. No. 60/222,209, filed 08/01/2000.

FIELD OF THE INVENTION

The present invention relates to a method to reduce charge interface trap density and channel hot carrier degradation in silicon metal oxide semiconductor transistors (MOSFET). The method uses deuterium enhanced oxidation to reduce the density of silicon dangling bonds at the silicon-silicon oxide interface.

BACKGROUND OF THE INVENTION

Integrated circuits are comprised of semiconductor devices which are fabricated on silicon wafers and/or substrates. The main building block of CMOS integrated circuits is the enhancement mode MOSFET. The enhancement mode MOSFET (or MOSFET) is a four terminal device comprising a source, a drain, a substrate, and a gate terminal. In general, voltage applied to the gate controls the flow of electrons or holes from the source terminal to the drain terminal. The gate of the MOSFET comprises a gate dielectric layer over the silicon surface and a conductive layer over the gate dielectric. The MOSFET shown in FIG. 1 is an NMOS device. Here the substrate 10 is p-type silicon and the source region 20 and drain region 30 are doped n-type. The gate dielectric 40 and the conductive gate terminal 50 are also shown. In operation, a positive voltage is applied to the gate 50 and drain 30 with the source 20 and substrate 10 grounded. Under certain voltage conditions a depletion layer 60 and an inversion layer or channel 70 will form beneath the gate and the transistor will be "on". The flow of current in the transistor is due to the flow of carriers in the inversion layer and it is this flow of inversion charge that determines the transistor properties. For a NMOS transistor the inversion layer will comprise electrons. As illustrated in FIG. 1, the inversion layer 70 is confined to the interface between the silicon substrate 10 and the gate dielectric 40. The physical and electrical characteristics of the silicon substrate 10 and gate dielectric 40 interface is therefore crucial in determining transistor performance.

Shown in FIG. 2 are the main sources of charge in a silicon oxide gate dielectric layer that affect the inversion layer and thus transistor performance. The fixed oxide charge 80 and the mobile ionic charge 90 are due to intrinsic and extrinsic defects in the oxide. These defects are usually distributed throughout the oxide and will have a second order effect on the inversion layer 70. The defects that will have the largest effect on the inversion layer 70 and thus transistor performance will be the interface states 100. These interface states 100 exist in all silicon oxide-silicon interfaces and are due to the presence of silicon dangling bonds. These silicon dangling bonds are unsaturated bonds and can be due to a number of different factors including chemical and lattice mismatch, metallic impurities, and radiation. The energy states associated with these dangling bonds can interact with the silicon and thus the inversion layer 70. A good control of these interface states is thus very important because of the large deleterious effect these states have on transistor performance. Under normal use hot carriers are produced in the inversion layer region of the transistor. These hot carriers can enter the dielectric gate layer and become trapped in the interface states where they cause a shift in the threshold voltage and transconductance of the transistor. Such shifts often lead to a degradation in transistor and integrated circuit performance. Interface states also have a strong effect on carrier surface mobility and their density is related to the 1/f noise in MOSFETs. In addition to affecting transistor performance interface states can also cause charge transfer losses in charge coupled devices, as well as affecting the refresh time in DRAMs. Currently, silicon wafers are sintered at 450–500° C. in hydrogen, wet nitrogen or forming gas to reduce the density of the interface states. This low temperature anneal is usually combined with the sintering step after metallization and can reduce the concentration of these interface states to mid $10^{10}$ cm$^{-2}$ eV$^{-1}$ for silicon (100) material. Reducing this concentration further will result in improvements in transistor performance. Such improvements are becoming increasingly necessary as transistors are scaled in the ultra large scale integration era. There is therefore a need for a method for reducing the concentration of interface states below that currently obtainable.

SUMMARY OF INVENTION

The method of the instant invention comprises a deuterium based steam oxidation process to form an oxide dielectric film on a silicon substrate. The method comprises: flowing a first amount of oxygen; flowing a second amount of deuterium to form a oxidizing vapor with said first amount of oxygen; inserting a silicon substrate with an upper surface in said oxidizing vapor; and increasing the temperature of said silicon substrate in said oxidizing vapor to form a dielectric layer on said upper surface. Other technical advantages will be readily apparent to one skilled in the art from the following FIGUREs, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1:
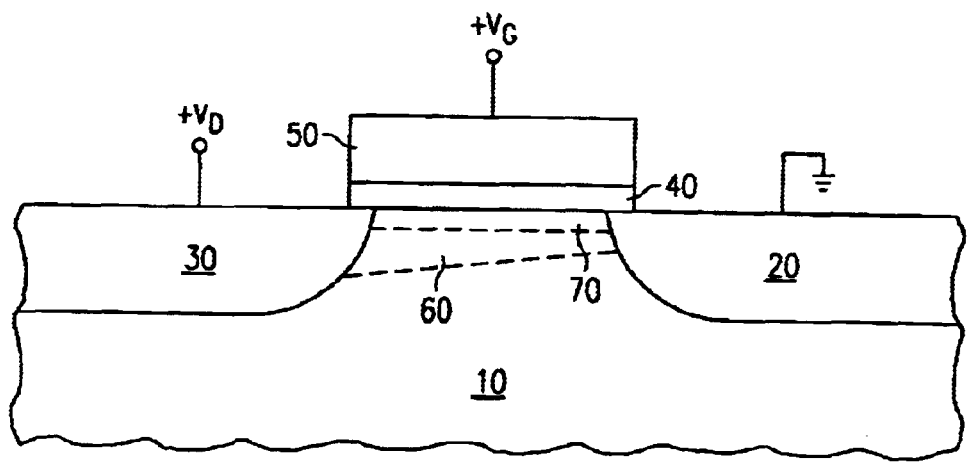
FIG. 1 is an schematic diagram of a MOS transistor.
Figure 2:
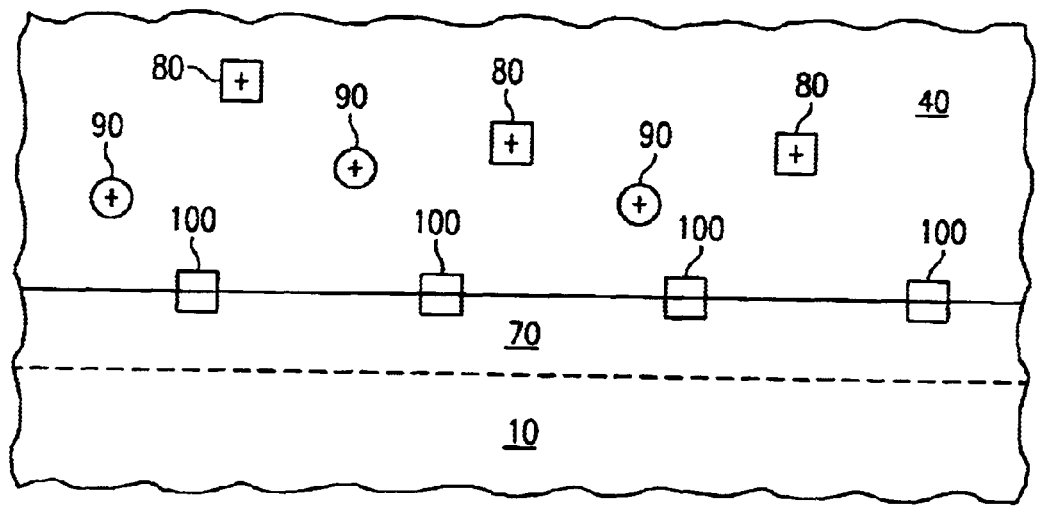
FIG. 2 is a cross-section diagram slowing the charges present in a gate dielectric layer.

The instant invention describes a method of forming silicon oxide using deuterium ($D_2$) in a wet oxidation environment. Deuterium is intrinsically better at reducing CHC degradation compared to hydrogen due to electronic and vibrational differences. When an interface charge trap is passivated with hydrogen, the hydrogen may be lost due to thermal or vibrational excitation. If the bond between the silicon atom and the passivating hydrogen is broken, the hydrogen atom is very likely to be lost, and the charge trap regenerated. When deuterium is used as the passivating agent and the silicon-deuterium bond is broken, the deuterium, unlike hydrogen, has a high probability of recapture by the silicon atom, thus re-establishing the charge trap. This is due to the fact that deuterium has one neutron; hydrogen has none, and therefore deuterium is heavier and slower and less likely to be lost than hydrogen. Additionally, by introducing deuterium during steam oxidation, these charge traps may be reduced significantly, thus avoiding the necessity of a later processing step for interface state passivation.

In forming MOS transistors on silicon substrates, the gate dielectric layer can comprise an oxide, an oxynitride, a silicate or a combination of these materials. Although these dielectric layers can be formed using a variety of techniques, the most common method is that of thermal oxidation. In this process the silicon wafer is heated in an oxidizing ambient. An embodiment of the instant invention illustrating the use of deuterium in a steam oxidation process is shown in Table I.

TABLE I

| Step | N (SCCM) | $O_2$ (SCCM) | $D_2$ (SCCM) | Temp (° C.) (±200° C.) | Additional settings |
| --- | --- | --- | --- | --- | --- |
| Standby | 15,000 | 0 | 0 | 750 | |
| Wafer Charge | 15,000 | 0 | 0 | 750 | |
| Boat up | 15,000 | (150) | 0 | 750 | |
| Temp. recovery | 15,000 | (150) | 0 | 750 | |
| Temp. ramp | 15,000 | (150) | 0 | 850 | 5° C./min. |
| Temp. stability | 15,000 | (150) | 0 | 850 | |
| Oxidation step | | 10,000 ± 2000 | 5,000 ± 1000 | 850 | 0.5 atm.–25 atm. |
| Anneal | 15,000 | 0 | 0 | 850 | |
| Ramp | 15,000 | 0 | 0 | 750 | |
| Boat down | 15,000 | 0 | 0 | 750 | |
| End | 15,000 | 0 | 0 | 750 | |

This process is performed in vertical furnace however the instant invention can be applied in any thermal or plasma oxidation system. The process is a pyrogenic technique which reacts $D_2$ and $D_2$ to form an oxidizing vapor. The heating of the wafer in the presence of this oxidizing vapor forms an oxide on the wafer surface. During the loading of the wafers into the furnace tube (boat up step), the temperature recovery, the temperature ramp to the oxidation temperature, and temperature stability step a small amount of oxygen can be flowed through the furnace. This flow of oxygen can be eliminated if no oxide growth is desired during these pre-oxidation steps.

During the oxidation step, oxygen and deuterium are introduced in to the furnace (or oxidation tube) at the flow rates, temperatures and pressures shown in Table 1. Deuterium in gaseous form and can easily be introduced into existing oxidation furnaces. The flow rate of oxygen can range for 6000 to 14,000 sccm. The flow rate of deuterium can range from 3000 to 7000 scam. The pressure of gases surrounding the silicon substrate during the oxidation process can vary from about 0.5 atmospheres to 25 atmospheres. The wafer temperature during the oxidation process can be between about 650 to 1025° C.

In another embodiment of this invention, HCL qas can be introduced into the furnace during the thermal oxidation process step. In addition, the instant invention can cc extended to other thermal oxidation techniques such as rapid thermal steam oxidation and plasma oxidation. In these embodiments the silicon wafer is exposed to $D_2$ and $D_2$ during the oxidation step. Oxidation temperatures during these techniques can range between 400° C. and 1200° C. at pressures from 0.5 atmospheres to 25 atmospheres.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

What is claimed is:

1. A method of forming a silicon containing film, comprising:

flowing a first amount of oxygen;

flowing a second amount of deuterium to form an oxidizing vapor with said first amount of oxygen;

inserting a silicon substrate with an upper surface in said oxidizing vapor;

setting the pressure of said oxidizing vapor on said upper surface of said silicon substrate to between 8.1 atmosphere and 25 atmospheres; and increasing the temperature of said silicon substrate in said oxidizing vapor to form a dielectric layer on said upper surface.

2. The method of claim 1 wherein said flowing of said first amount of oxygen comprises a flow rate of 6000 sccm to 14,000 sccm.

3. The method of claim 1 wherein said flowing of said second amount of deuterium comprises a flow rate of 3000 sccm to 7000 sccm.

4. The method of claim 1 wherein said increasing the temperature of said silicon substrate comprises increasing the temperature to between 650° C. and 1025° C.

5. The method of claim 1, further comprising flowing HCL in said oxidizing vapor.

* * * * *